United States Patent [19]

Cummings

[11] 4,187,467
[45] Feb. 5, 1980

[54] GROUNDED RF POWER AMPLIFIER CIRCUIT APPARATUS

[75] Inventor: Forest M. Cummings, Richardson, Tex.

[73] Assignee: Rockwell International Corporation, El Segundo, Calif.

[21] Appl. No.: 881,098

[22] Filed: Feb. 24, 1978

[51] Int. Cl.² .................................................. H04B 17/00
[52] U.S. Cl. ........................................ 325/133; 325/149; 324/110
[58] Field of Search ................. 325/67, 104, 105, 120, 325/133, 149, 150, 151, 171, 172, 178; 324/110, 124; 328/7–10; 332/63

[56] References Cited

U.S. PATENT DOCUMENTS

| | | | |
|---|---|---|---|
| 1,938,136 | 12/1933 | Crew | 324/124 |
| 2,534,928 | 12/1950 | Schneeberger | 324/124 |
| 3,281,697 | 10/1966 | Hansen et al. | 325/151 |
| 3,496,471 | 2/1970 | Shelton | 325/151 |

Primary Examiner—Robert L. Griffin
Assistant Examiner—Jin F. Ng
Attorney, Agent, or Firm—Bruce C. Lutz; Howard R. Greenberg; H. Fredrick Hamann

[57] ABSTRACT

Apparatus for and the method of simplifying and economizing upon transmitter power amplifier output stage circuitry is illustrated. By grounding the anode of the RF power amplifier, the FCC required plate voltage meter and plate current meters can be connected to near ground potentials and the requirements for a high voltage coupling capacitor between the anode and the antenna is eliminated. Although the specific embodiment illustrated uses a pulse-width modulated cathode modulation scheme, any type of cathode modulation will perform in accordance with the concepts of this invention.

11 Claims, 4 Drawing Figures

FIG. 1

PRIOR ART

GROUNDED RF POWER AMPLIFIER CIRCUIT APPARATUS

THE INVENTION

The present invention is generally concerned with electronics and more specifically concerned with circuitry for reducing safety hazards and cost of an RF power output amplifier stage of a broadcast transmitter.

As will be realized by those skilled in the art, the FCC (Federal Communications Commission) has required that broadcast transmitters have incorporated therein a plate voltage meter for measuring the voltage between anode and cathode of the final power stage of the broadcast transmitter. In addition, a plate current meter is required as an indication of current through the output tube so that DC power input to the final power amplifier stage can be calculated.

In the prior art the anode of the output stage has been connected to a high voltage power source which in a typical broadcast device is about 13,000 volts. In general the cathode of this tube is about 5,000 volts less or in other words is about 8,000 volts. Thus, the two terminals on the volt meter are at relatively high potentials either 8,000 or 13,000 volts and since it is difficult to isolate the case from at least one of the terminals, the case of the meter may also be at a very high potential. A similar situation occurs with the current meter. Since there are other drains for current supplied by the power supply, the current meter must be in close proximity to the anode or the cathode of this particular RF power tube. Thus, the voltage potential problem also occurs with this metering device. The problem occurs even if voltage dividers or shunt resistors are used to prevent connection of the meters directly to the terminals of the tube. A final problem with the prior art is that because the anode is at the very high (13,000 volt) potential, there must be a coupling capacitor utilized between the anode and the antenna since it is undesirable to have the antenna at extremely high direct voltage potentials. To prevent voltage breakdown problems and to allow sufficient bandwidth through the capacitor, it had to be very large in physical size and in almost all cases was designed using mica or a vacuum as the dielectric. This capacitor not only added bulk to the transmitter but added cost to the device.

The present inventive concept eliminates these problems by the recognition, for the first time in the over twenty years since the FCC rule was instigated, that the anode of the output tube may be connected to DC ground so that both meters are at ground potential if used in conjunction with voltage dividers and shunt resistors or at least one terminal is at ground even if the meter is connected directly across the output tube. Further, the coupling capacitor is eliminated as a requirement and the anode of the tube can thus be connected directly (via a DC current path) to the antenna without encompassing safety or ground-problems. The present approach does introduce voltage problems into the series or cathode connected modulator but these have been solved as illustrated in a co-pending application Ser. No. 881,099, filed Feb. 24, 1978, now abandoned. The voltage problems could have been solved in the prior art by other means such as using transformer coupling but each such a solution could add nearly as much weight and expense as the antenna coupling capacitor which has been used in the prior art and the need for which is eliminated by this invention.

It is thus an object of the present inventive concept to provide an improved RF power amplifier and modulation concept.

Other objects and advantages of the present invention will be ascertained from a reading of the specification and appended claims in conjunction with the drawings wherein:

DETAILED DESCRIPTION

Figure 1:
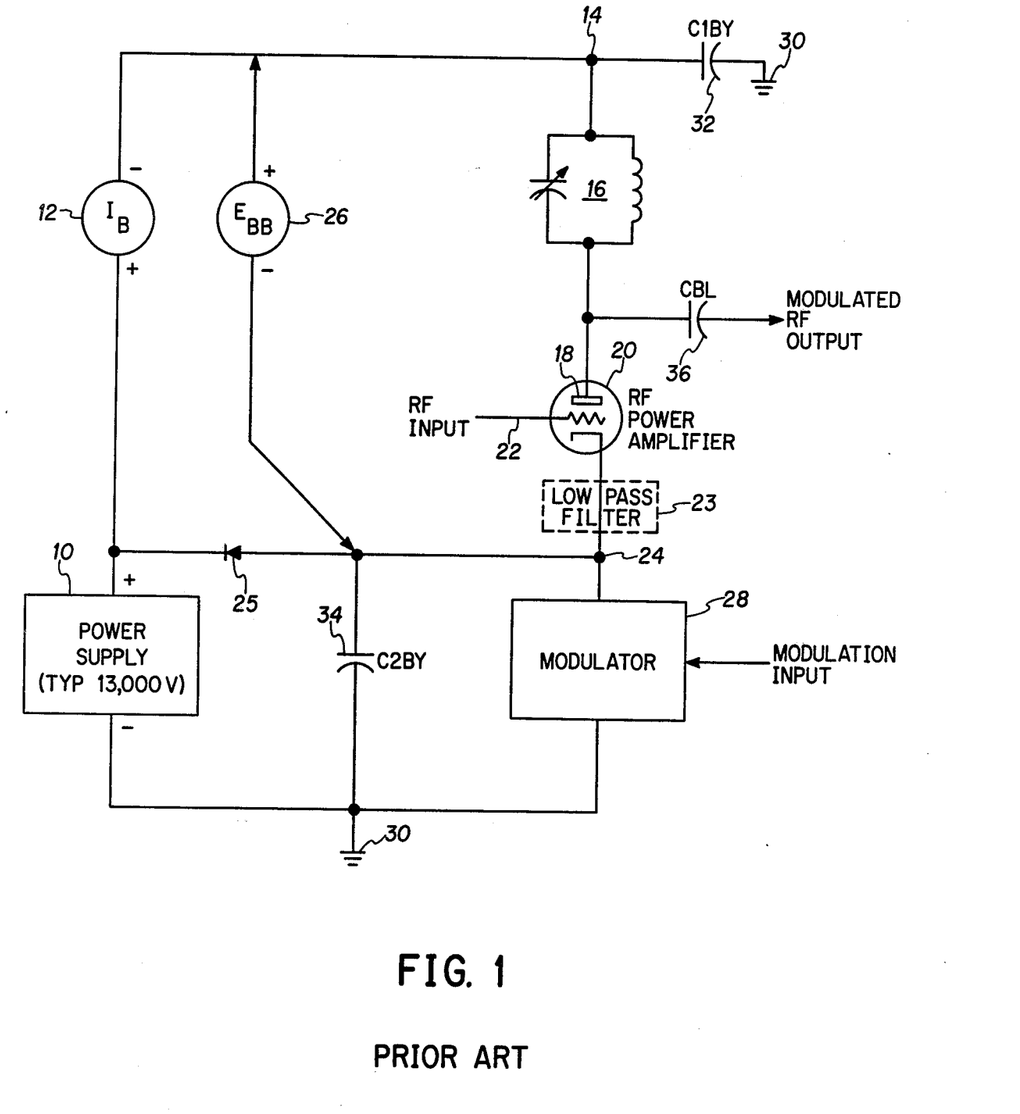
FIG. 1 is a block schematic diagram of the prior art attempts at cathode modulation of an RF power amplifier.

In FIG. 1 a power supply generally indicated as 10 supplies power on the positive terminal side through a meter 12 to a junction point 14. A band-pass carrier frequency filter 16 is connected between junction point 14 and an anode 18 of an RF power amplifier tube 20 having an grid terminal 22 connected to a source of RF carrier input and a cathode connected through a low-pass filter 23 to a junction point 24. A diode 25 is connected between junction point 24 and the positive terminal of supply 10. A plate voltage meter 26 is connected between junction points 14 and 24. A modulator 28 is connected between junction point 24 and the negative terminal of power supply 10. This negative terminal of power supply 10 is also connected to ground 30. A by-pass capacitor 32 is connected between junction point 14 and ground 30 while a second by-pass capacitor 34 is connected between junction point 24 and ground 30. Finally, an output coupling capacitor 36 is shown connected to anode 18.

Figure 2:
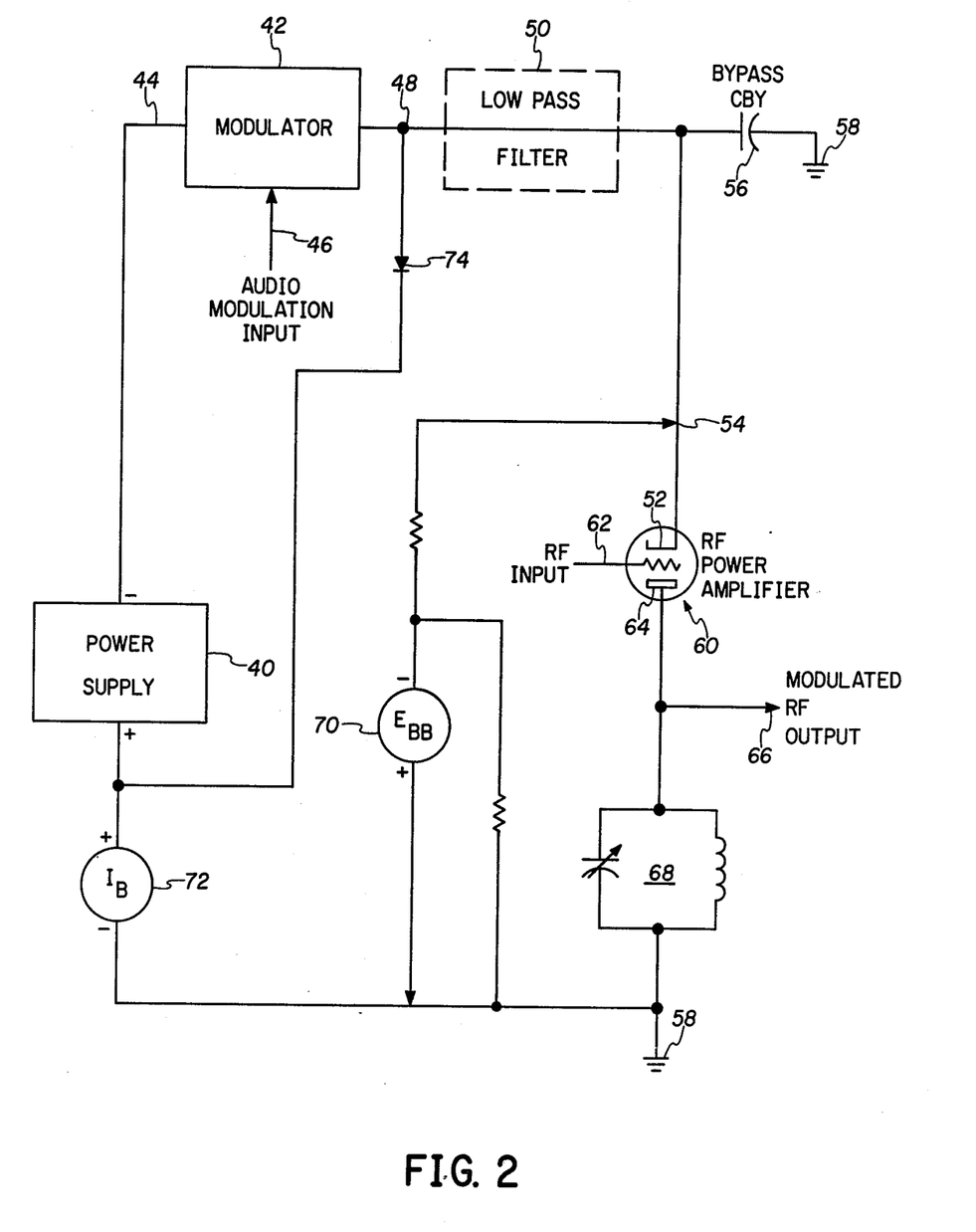
FIG. 2 is a block diagram of the present inventive concept.

In FIG. 2 a power supply 40 has its negative terminal connected to the power input of a series modulator 42 via a lead 44. This modulator 42 receives audio modulation input signals on a lead 46 and provides an output on a lead 48 to a low-pass filter shown in dash lines as 50. An output of low-pass filter 50 is connected to a cathode 52 of an RF power amplifier stage via a lead 54 and via the same lead is connected through a by-pass capacitor 56 to ground or reference potential 58. The RF power amplifier tube is generally designated as 60 and has a grid 62 connected to an RF carrier current supply not shown. A plate or anode 64 is connected to a modulated RF output terminal 66 and is also connected through a band-pass filter 68 to ground 58. A plate voltage meter or voltage measuring means 70 is connected between ground 58 and cathode 54 of tube 60. A current measuring device 72 is connected between the positive terminal of power supply 40 and ground 58. In actuality the meter 70 would not normally be connected directly as shown but would rather be connected across a voltage divider and would be connected near the ground portion of the voltage divider to provide the voltage indication. Likewise the current meter 72 would be in parallel with a shunt resistor and would thus pass only a minute amount of the actual current supplied by power supply 40 although it would provide an indication due to the voltage across the shunt resistor. Finally, a diode 74 is connected between line 48 and the positive terminal of power supply 40.

Figure 3A:
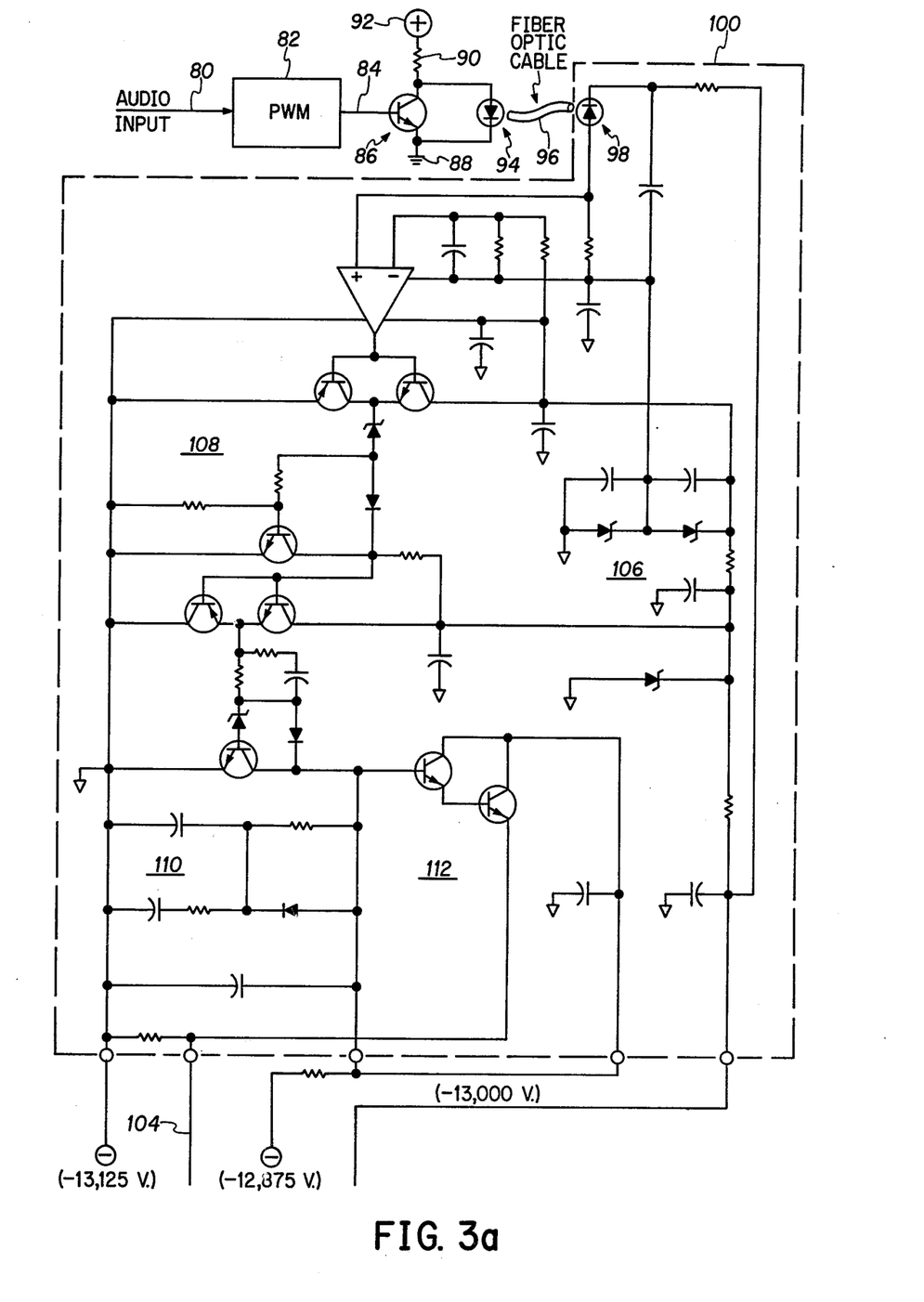
FIGS. 3a and 3b comprise a detailed schematic diagram showing in more detail the contents of some of the blocks of FIG. 2.
Figure 3B:
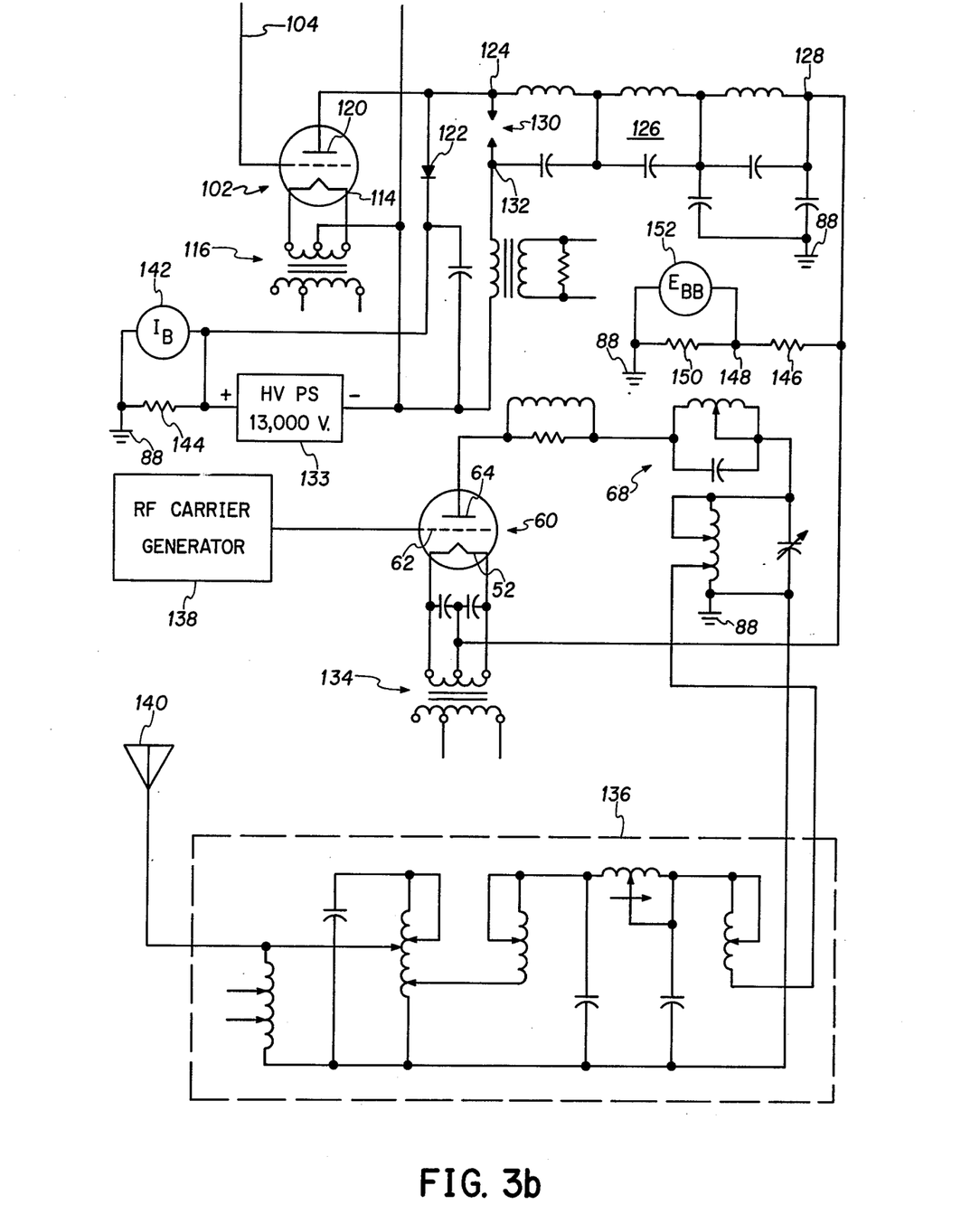

In FIG. 3 an audio input signal is delivered via a lead 80 to a pulse-width modulator 82. An output of pulse-width modulator 82 is supplied on a lead 84 to an NPN transistor generally designated as 86 having its emitter connected to ground 88 and its collector connected through a resistor 90 to positive power supply 92. A light emitting diode generally designated as 94 is connected with its anode to the collector of transistor 86 and its cathode to the emitter. A fiber optic cable 96 is connected between the diode 94 and a photosensitive diode 98 in a switchboard card generally designated as 100. The operation of the switchboard card 100 is fairly standard in that it merely amplifies the signals received over the optic cable 96 to a level where they can drive a switching modulator tube 102 connected to the output lead 104 of block 100. The area generally indicated as 106 is a section providing various voltages for circuit operation while amplification of the signal from the LED occurs in the area generally designated as 108. In the area generally designated as 110 the rise and fall time of the pulse-width modulated signal is adjusted in accordance with the length of the pulse before being output by the final amplifying stage 112 of the card before being supplied on lead 104 to switching modulator tube 102. The fiber optic signal voltage isolation concept is discussed in my previously mentioned co-pending application Ser. No. 881,099, filed Feb. 24, 1978, now abandoned and the pulse-width modulation or rise time adjustment scheme is more fully disclosed in my co-pending application Ser. No. 881,097, filed Feb. 24, 1978, now U.S. Pat. No. 4,140,980. A cathode 114 (which also serves a function as a heating element for 102) is connected to a transformer generally designated as 116 for supplying alternating heating currents. A center tap of this transformer is connected to a minus voltage which in one embodiment of the invention was 13,000 volts. As previously indicated the grid of this tube is connected to input lead 104 while an anode or plate 120 is connected to an anode of a spike suppression diode 122 and is also connected to a junction point 124. A plurality of inductors and filters 126 are connected between junction point 124 and a junction point 128. An arc suppressor generally designated as 130 is connected between junction point 124 and a junction point 132 which is connected back to the negative supply 133 potential terminal of a high voltage power as a protection against too high a voltage from plate to cathode on tube 102. The cathode of diode 122 is connected to the positive terminal potential of a high voltage power supply 133 for preventing the anode 120 of tube 102 from rising more than about 50 volts above that reference potential when the tube 102 suddenly turns from a full ON to a full OFF condition thereby inducing back EMF voltages in the inductive sections of filter 126. Junction point 128 is connected through cathode heating circuitry generally designated as 134 in a direct current path to the cathode 52 of the RF power amplifier 60 having its anode 64 connected through tuning filter apparatus 68 to ground or reference potential 58. Additional filtering action is illustrated and designated generally as 136 between filter 68 and the RF output which provides a direct DC connection between the anode 64 of RF power amplifier 60 and an appropriate broadcast transmission antenna 140. A current meter 142 is connected between ground 88 and the positive terminal of power supply 133 and includes a resistor 144 connected in parallel with meter 142. A resistor 146 is connected between junction point 128 and junction point 148. Resistor 146 may in actual practice represent a plurality of series connected resistors. Resistor 150 is connected in parallel with a voltage meter 152 for providing an indication of the voltage across tube 60. The other end of each of components 150 and 152 is connected to ground 88.

OPERATION

As previously indicated, the prior art as illustrated in FIG. 1 has used a series modulator in the cathode circuit of an RF power amplifier output tube 20 wherein the grid of this tube is connected to an RF carrier source. This places the circuitry of the modulator 28 at or near ground potential and precludes any voltage adjustment problems between the modulation source and circuitry within modulator 28. However, as previously explained the terminals as well as the cases of the plate current meter 12 and the plate voltage measuring device 26 are at very high potentials since a typical power supply 10 is in the neighborhood of 13,000 volts. An additional problem with the prior art has been that the high voltage at the anode 18 of tube 20 necessitated that a high quality, large capacity, high voltage rated capacitor be used for coupling capacitor 36. This capacitor has typically been a mica or vacuum dielectric type and thus not only has the cost been high but the physical size of the capacitor has been large. While size is not as determining a factor in broadcast equipment as it is in airplane equipment, it is still desirable to reduce weight and size as well as cost in any type of consumer product. Additionally, although only qualified technicians are supposed to have their hands near the meters 12 and 26, it is occasionally necessary that the devices be adjusted or repaired and the high potential of these meters does provide potentially dangerous safety aspects. In normal construction, the meters are housed behind a protective glass (or other transparent) shield so that they are not accessible to accidental touching. However, the shield on occasion does get dirty and needs to be cleaned and additionally the glass enclosure contributes to inaccessibility of the entire equipment.

In FIG. 2 the present inventive concept is shown using very similar circuitry. However, the circuit does allow the elimination of the coupling capacitor 36 of FIG. 1 and in addition places both terminals of both the plate voltage meter 70 and the plate current meter 72 near ground potential. The prior art has in some instances taken care of the high voltage problem of the meters by using special circuitry to reduce the actual potential on the meters. However, this additional circuitry not only adds to the cost and complexity of the equipment but also reduces the accuracy of the metering. By using simple voltage dividers wherein the meter 70 is connected to the last stage of the voltage divider nearest ground 58, both the current meter 72 and the voltage meter 70 can have the terminals within a very few volts of ground. The modulator 42 can be any of various types of series modulators to perform cathode modulation which type of modulation is well-known to those skilled in the broadcast art. More recently, in view of the concern over energy usage, the modulator 42 has been designed as a pulse-width modulator. When a pulse-width modulator is used, a low-pass filter, shown as dash line block 50, is necessary to remove th PWM switching frequency (often in the neighborhood of 70 kilohertz) from the signal that is passed by RF amplifier 60 to the output antenna. Since the current from the RF power amplifier to the negative terminal of the power supply is being modulated at an audio rate, the passage of the switching signals to ground through low-pass filter 50 does not affect the audio modulation of the RF carrier signal being supplied at output 66. The filter 68 is a band-pass filter of the same frequency as the RF input and is used to maintain the RF carrier at the proper frequency and wave shape.

It may be thus ascertained that the modulator 42 can be any of various series modulators operating in accordance with an audio input 46 to cathode modulate the RF power amplifier and still fall within the scope of the invention.

The present invention was reduced to practice in a preferred embodiment shown substantially in FIGS. 3a and 3b. Only the final stages of the pulse-width modulator card are illustrated since the remaining circuitry is standard engineering design. The drive coming to transistor 86 from pulse-width modulator 82 is within a very few volts of ground since the power supply 92 in one embodiment of the invention is five volts positive with respect to ground. This transistor 86 operates in accordance with square wave inputs at a frequency in one embodiment of 70 kHz and varies the voltage across diode 94 in a square wave manner to change the light output therefrom. This light output may be applied directly through a lens to a photosensitive diode. However, the remaining circuitry within the switch card board 100 is referenced to minus 13,000 volts. It will be realized by those skilled in the art that when everything is clean and there is very low humidity, an air gap of approximately one inch will provide adequate dielectric separation between the LED and the photosensitive diode. However, under high humidity conditions and especially when the equipment is old and/or dirty, this gap must be greatly increased to prevent voltage breakdown. Thus, a fiber optic cable was used to couple the light from diode 94 through the optic cable 96 to the photosensitive diode 98. The signals appearing across diode 98 are amplified in the section generally indicated as 108 and passed to the pulse rise and fall time modifier 110 before being output on lead 104 to modulator tube 102. The signals on 104 are ON/OFF signals which are switched at 70 kHz to turn tube 102 between ON and OFF conditions. The ON and OFF conditions provide a modulation of current flow through the power amplifier tube 60. This current flow is smoothed by the filter 126 to shunt the 70 kHz signals to ground 88. The use of the inductors in filter 126 requires a clipping diode or spike reducing diode 122 to lower the spikes caused by back EMF during collapse of current through the inductive portions of filter 126. The cathode of diode 122 is connected through a resistor to ground 88 and thus the anode of tube 102 never rises more than about fifty volts above ground at the OFF condition when power amplifier tube 60 is fully ON. The point contacts 130 prevent too high a voltage from appearing anode to cathode across tube 102 and essentially act to break down under too high a voltage and draw an arc therebetween.

The modulation of current through power amplifier 60 alters the average amount of voltage available between anode and cathode 64 and 52 respectively of power amplifier tube 60. Thus, the output signal amplitude is directly affected by the pulse-width modulation of tube 102. In this way the audio signal (which produced the pulse-width modulation in the first place) affects the amplitude of a carrier signal supplied to the grid 62 of tube 60 and thus produces amplitude modulation of the output signal. This output signal is carried from the anode of tube 60 to the tuned circuit 68 and then out through additional filtering in a direct DC connection all the way to the antenna 140. The high voltage divider is connected between the junction point 128 and ground 88 substantially as shown in FIG. 2 with the plate voltage meter 70 being connected across one of the resistors near ground. Thus, it can be determined that the effective plate voltage is obtained while preventing high voltage terminals from being exposed in the vicinity of the meter 70. As also shown in FIG. 2, the current meter 72 is merely placed in the line between the positive terminal of the power supply 40 and ground 58 or 88 as shown in FIG. 2. The diode 74 is connected to the positive terminal of the high voltage power supply 40 to prevent its current from flowing in the current meter 72.

Although there are several new features in the disclosure, which are being covered in co-pending applications assigned to the same assignee as the present invention, almost any reasonably reliable power supply can be used for 40 and almost any series modulator can be used for modulator 42 to provide the cathode modulation of tube 60 in accordance with the audio input on 46. I have shown a specific implementation to aid those in designing a specific RF transmitter. However, my inventive concept is related to DC grounding the anode of the RF power amplifier so as to reduce dangerous voltage potentials on the FCC required meters and related to the ability to remove the coupling capacitor shown as 36 in FIG. 1 so as to provide a direct connection between the anode of amplifier 60 and the antenna. Both of these features are significant by themselves and it is believed that each of these advancements are sufficient reason for patent coverage.

In view of the above I wish to be limited, not by the actual embodiment disclosed, but only by the scope of the claims appended.

I claim:

1. The method of reducing hazardous voltage potentials on anode voltage meters used in the final stage of an RF power amplifier of a radio transmitter comprising, the steps of:
   connecting an anode of a RF power amplifier tube to DC ground potential;
   connecting a series circuit cathode modulator between the cathode of said RF tube and a high negative voltage power terminal with respect to said DC ground potential; and
   connecting an anode voltage meter in parallel with RF power amplifier tube for measuring anode-to-cathode voltage.

2. The method of reducing hazardous voltage potentials on anode current meters used to measure the current in the final stage of a RF power amplifier of a radio transmitter comprising, the steps of:
   connecting a two terminal current meter in series between a positive terminal of a power supply and an anode of a RF power amplifier tube;
   connecting one of the terminals of the current meter to DC ground potential; and
   connecting an audio cathode modulator between the cathode of said RF tube and a high negative voltage terminal of the power supply.

3. The method of eliminating the requirement for a high voltage coupling capacitor between a RF tube in the final stage of a RF power amplifier of a radio transmitter and its associated antenna comprising, the steps of:

connecting the anode of the RF power amplifier tube through tuning circuitry to DC ground; and connecting a series cathode modulator means between the cathode of said RF tube and a greater than 600 volt negative terminal of a power supply whereby the output of the transmitter from the anode of the tube is referenced to DC ground potential so that a coupling capacitor is not required.

4. Apparatus for reducing hazardous high voltage conditions comprising, in combination:

high voltage direct current power supply means comprising relatively positive and negative terminal means;

RF power amplifier tube means including anode means, control means and cathode means;

anode current measuring means connected between said positive terminal means of said power supply means and said anode means of said tube means;

reference potential means DC connected to a terminal of said anode current measuring means;

RF carrier signal supply means connected to control means of said tube means;

audio signal cathode modulation means connected between said cathode means of said tube means and said negative terminal means of said power supply means; and apparatus output means connected to said anode means of said tube means.

5. Apparatus for reducing hazardous high voltage conditions comprising, in combination:

high voltage direct current power supply means comprising relatively positive and negative terminal means;

reference potential means DC connected to said positive terminal means of said power supply means;

RF power amplifier tube means including anode means, control means and cathode means;

tuning circuit means connected between said reference potential means and said anode means of said tube means;

voltage measuring means connected to said tube means and in parallel therewith for measuring the voltage across said tube means whereby both terminals of a voltage meter portion of said voltage measuring means are near the potential of said reference potential means;

RF carrier signal supply means connected to control means of said tube means;

audio signal cathode modulation means connected between said cathode means of said tube means and said negative terminal means of said power supply means; and apparatus output means connected to said anode means of said tube means.

6. Apparatus as claimed in claim 5 wherein said apparatus output means comprises a direct current connection between said anode means of said tube means and an antenna load means.

7. The method of reducing hazardous voltage potentials on plate voltage meters used in the final stage of a RF power amplifier of a radio transmitter comprising, the steps of:

connecting a plate of a RF power amplifier tube to DC ground potential;

connecting an audio cathode modulator between the cathode of said RF tube and a high negative voltage terminal of a power supply;

connecting a positive voltage terminal of said power supply to DC ground potential; and connecting a voltage dividing network, including a plate voltage meter, in parallel with the RF power amplifier tube for measuring plate-to-cathode voltage.

8. Apparatus for reducing hazardous voltage potentials on anode current meters used to measure the current in the final stage of a RF power amplifier of a radio transmitter comprising, in combination:

RF power amplifier tube means;

ground potential means;

power supply means;

current metering means, including first and second terminals, connected in series between an anode of the RF power amplifier tube and a positive terminal of said power supply means;

means connecting one of said first and second terminals of said current metering means to said ground potential means for providing a direct current path therebetween; and means for connecting a series cathode modulator between a cathode of said RF tube means and a large negative voltage terminal of said power supply means.

9. Apparatus for reducing hazardous voltage potentials on anode voltage meters used in the final stage of an RF power amplifier of a radio transmitter comprising, in combination:

RF power amplifier tube means;

ground potential means;

means for DC connecting an anode of the RF power amplifier tube means to said ground potential means;

series cathode modulator means;

power supply means including positive and negative terminal means;

means connecting said positive terminal means of said power supply means to said ground potential means;

means for connecting said series cathode modulator means between the cathode of said RF tube means and said negative voltage terminal means of said power supply means;

anode voltage metering means; and means for connecting said anode voltage metering means to said RF power amplifier tube means for measuring the anode-to-cathode voltage thereof.

10. Apparatus as claimed in claim 9 wherein the means for connecting the metering means to said RF tube means comprises a resistor voltage divider network and a voltage meter whereby both terminals of the voltage meter are connected across a portion of the divider network which is near ground potential.

11. Apparatus for reducing hazardous voltage potentials on components such as anode voltage meters used in connection with the final stage of a RF power amplifier of a radio transmitter comprising, in combination:

RF power amplifier tube means;

ground potential means;

means for DC connecting an anode of the RF power amplifier tube means to said ground potential means;

series cathode modulator means;

high voltage power supply means including positive and negative terminal means having a direct voltage difference of greater than 600 volts;

means connecting said positive terminal means of said power supply means to said ground potential means;

means for connecting said series cathode modulator means between the cathode of said RF tube means and said negative voltage terminal means of said power supply means; and means for connecting at least one of said components to said apparatus for measuring a parameter of said tube means.

* * * * *

UNITED STATES PATENT AND TRADEMARK OFFICE
CERTIFICATE OF CORRECTION

PATENT NO. : 4,187,467
DATED : 2/5/80
INVENTOR(S) : Forest M. Cummings

It is certified that error appears in the above-identified patent and that said Letters Patent are hereby corrected as shown below:

IN THE SPECIFICATION:

Column 3, line 45, after "negative" insert --potential terminal of a high voltage power--;

Column 3, line 46, delete "potential terminal of a high voltage power";

Column 4, line 64, delete "th" and substitute therefor --the--.

Signed and Sealed this

Twenty-second Day of July 1980

[SEAL]

Attest:

SIDNEY A. DIAMOND

Attesting Officer

Commissioner of Patents and Trademarks